United States Patent
Peil et al.

(10) Patent No.: US 9,252,341 B2
(45) Date of Patent: Feb. 2, 2016

(54) OPTOELECTRONIC CHIP-ON-BOARD MODULE

(71) Applicant: Heraeus Noblelight GmbH, Hanau (DE)

(72) Inventors: Michael Peil, Otzberg (DE); Florin Oswald, Frankfurt am Main (DE); Harald Maiweg, Korschenbroich (DE)

(73) Assignee: Heraeus Noblelight GmbH, Hanau (DE)

( * ) Notice: Subject to any disclaimer, the term of this patent is extended or adjusted under 35 U.S.C. 154(b) by 0 days.

(21) Appl. No.: 14/617,067

(22) Filed: Feb. 9, 2015

(65) Prior Publication Data

US 2015/0155453 A1 Jun. 4, 2015

Related U.S. Application Data

(62) Division of application No. 13/819,983, filed as application No. PCT/EP2011/004327 on Aug. 29, 2011, now Pat. No. 9,093,622.

(30) Foreign Application Priority Data

Sep. 6, 2010 (DE) .......................... 10 2010 044 470

(51) Int. Cl.
*H01L 33/54* (2010.01)
*H01L 31/0203* (2014.01)
*H01L 21/56* (2006.01)
*H01L 23/24* (2006.01)
*H01L 23/31* (2006.01)
(Continued)

(52) U.S. Cl.
CPC ................ *H01L 33/54* (2013.01); *H01L 21/56* (2013.01); *H01L 23/24* (2013.01);
(Continued)

(58) Field of Classification Search
None
See application file for complete search history.

(56) References Cited

U.S. PATENT DOCUMENTS

| 2002/0132873 | A1 | 9/2002 | Papathomas et al. |
| 2003/0173655 | A1 | 9/2003 | Rissing et al. |

(Continued)

FOREIGN PATENT DOCUMENTS

| CN | 101657748 A | 2/2010 |
| JP | 2006-114737 A | 4/2006 |

(Continued)

OTHER PUBLICATIONS

Office Action issued Apr. 3, 2015 in CN Application No. 201180042797.6 (with German translation).
(Continued)

*Primary Examiner* — Khaja Ahmad
(74) *Attorney, Agent, or Firm* — Panitch Schwarze Belisario & Nadel LLP

(57) ABSTRACT

A method is provided for coating an optoelectronic chip-on-board module, including a flat substrate populated with one or more optoelectronic components, having a transparent, UV-resistant, and temperature-resistant coating made of one or more silicones. A corresponding optoelectronic chip-on-board module and a system having multiple optoelectronic chip-on-board modules are also provided. The method includes the following steps: a) preheating the substrate to be coated to a first temperature; b) applying on the preheated substrate a dam that encloses a surface area or partial area of the substrate to be coated, the dam being made of a first, heat-curable, highly reactive silicone that cures at the first temperature; c) filling the surface area or partial area of the substrate enclosed by the dam with a liquid second silicone; and d) curing the second silicone.

6 Claims, 2 Drawing Sheets

(51) Int. Cl.
  *H01L 33/56* (2010.01)
  *H05K 3/28* (2006.01)
  *H01L 31/0232* (2014.01)
  *H01L 27/144* (2006.01)
  *H01L 27/15* (2006.01)
  *F21K 99/00* (2010.01)
  *F21Y 101/02* (2006.01)
  *H05K 1/02* (2006.01)

(52) U.S. Cl.
  CPC ....... *H01L 23/3121* (2013.01); *H01L 27/1446* (2013.01); *H01L 27/15* (2013.01); *H01L 31/0203* (2013.01); *H01L 31/02325* (2013.01); *H01L 33/56* (2013.01); *H05K 3/284* (2013.01); *F21K 9/90* (2013.01); *F21Y 2101/02* (2013.01); *H01L 2924/0002* (2013.01); *H01L 2933/005* (2013.01); *H05K 1/0274* (2013.01); *H05K 2201/0108* (2013.01); *H05K 2201/0162* (2013.01); *H05K 2201/0175* (2013.01); *H05K 2201/09909* (2013.01); *H05K 2201/10106* (2013.01); *H05K 2201/10121* (2013.01); *H05K 2201/10151* (2013.01); *H05K 2203/0126* (2013.01)

(56) References Cited

U.S. PATENT DOCUMENTS

| | | |
|---|---|---|
| 2007/0170454 A1 | 7/2007 | Andrews |
| 2007/0278512 A1 | 12/2007 | Loh et al. |
| 2007/0289129 A1 | 12/2007 | Wing et al. |
| 2008/0112162 A1 | 5/2008 | Chan |
| 2009/0134414 A1 | 5/2009 | Li et al. |
| 2009/0166657 A1 | 7/2009 | Yamada et al. |
| 2010/0051988 A1 | 3/2010 | Mitsuishi et al. |
| 2010/0078664 A1* | 4/2010 | Helbing ............ H01L 33/54 257/98 |
| 2011/0108870 A1 | 5/2011 | Jaeger et al. |
| 2012/0061702 A1* | 3/2012 | Andrews ............ H01L 33/54 257/98 |
| 2013/0154130 A1 | 6/2013 | Peil et al. |

FOREIGN PATENT DOCUMENTS

| | | |
|---|---|---|
| JP | 2009-102574 A | 5/2009 |
| JP | 2010-170990 A | 8/2010 |
| WO | 9823427 A1 | 6/1998 |
| WO | 0188978 A1 | 11/2001 |
| WO | 2008109813 A2 | 9/2008 |

OTHER PUBLICATIONS

Int'l Search Report issued Nov. 15, 2011 in Int'l Application No. PCT/EP2011/004327.

Office Action issued Jun. 7, 2011 in DE Application No. 10 2010 044 470.7.

German translation of an Office Action issued Apr. 21, 2014 in JP Application No. 2013-527484.

Office Action issued Nov. 6, 2014 in U.S. Appl. No. 13/819,983.

\* cited by examiner

OPTOELECTRONIC CHIP-ON-BOARD MODULE

CROSS-REFERENCE TO RELATED APPLICATIONS

This application is a divisional of co-pending U.S. patent application Ser. No. 13/819,983 filed Feb. 28, 2013, which is a Section 371 of International Application No. PCT/EP2011/004327, filed Aug. 29, 2011, which was published in the German language on Mar. 15, 2012, under International Publication No. WO 2012/031704 A1 and the disclosures of which are incorporated herein by reference.

BACKGROUND OF THE INVENTION

The invention relates to a method for coating an optoelectronic chip-on-board module, which comprises a flat substrate populated with one or more optoelectronic components, having a transparent, UV-resistant, and temperature-resistant coating made of one or more silicones. The invention also relates to a corresponding optoelectronic chip-on-board module and to a system having several optoelectronic chip-on-board modules.

Optoelectronic chip-on-board modules of this general class are used, for example, as illuminating elements, as high-power UV LED lamps, as photovoltaic modules, as sensors, or the like. The optoelectronic components used here are, in the scope of the invention, but not exclusively, LEDs or photodiodes in the form of chips or other components arranged in the chip-on-board module on a flat substrate, that is, a metal, ceramic, or silicon substrate, a metal core or FR4 circuit board, a glass substrate, a plastic substrate, or the like. These chip-on-board modules must be protected from mechanical damage and corrosion. For this purpose, the most compact and light-weight solutions possible are desired.

A protection in the form of housings on chip-on-board modules is often expensive and technologically complicated. One practical alternative for the protection of chip-on-board modules is a flat encapsulation of the components with a plastic-based encapsulation or casting material. Together with other functional components, such as circuit boards and contacting elements, the optoelectronic components in chip-on-board modules are protected, together with a flat substrate, from mechanical damage and corrosion by coatings.

Typically, epoxy resins are used for this purpose. These are deposited as an encapsulation material, initially as a fluid and then cured by heat and/or radiation. Since the encapsulation material is initially a fluid, the encapsulation material must be prevented from flowing away. This is typically realized by a mold or a fixed frame.

The so-called "dam and fill" method forms one alternative here, wherein initially a plastic dam is applied on the substrate of the chip-on-board module, the dam enclosing an area of the substrate in which a fluid filling compound made of epoxy resin is then filled. This compound is cured. The dam and filling compound together form the coating of the module. For generating the dam, in this method, a viscous polymer is deposited with a dispensing device or drawn out and then cured, so that encapsulation material can be cast on the surface enclosed by the dam, without this material flowing away.

The plastic dam generated in this manner, however, is not transparent. Therefore, the luminous radiation intensity or light sensitivity of optoelectronic chip-on-board modules coated in this manner, that is, chip-on-board modules populated with optoelectronic components, such as LEDs or photodiodes, is adversely affected toward the edge.

One class of additional materials that can be used as a dam in a "dam and fill" method is the class of thixotropic epoxy resins. These are used for this purpose, for example, in the manufacture of chip cards. Thixotropic epoxy resins are treated so that their viscosity depends on the mechanical force application and its duration. Therefore, the application of force on the dam liquefies the thixotropic epoxy resins, and the relaxation of the material after emerging from a nozzle subsequently solidifies it. Thus, they are well suited for generating a stable dam in a "dam and fill" method. Epoxy resins, however, are not UV-resistant and therefore are unstable in a high-power UV LED module or also under intense solar irradiation with UV components, like those in photovoltaic cells. They age quickly under UV loading and are destroyed.

Up to now no method for realizing a flat coating for chip-on-board modules has been known in which materials, which are both UV-resistant and also temperature-resistant and are likewise transparent for electromagnetic radiation from the ultraviolet to the infrared spectral range, are used both in the surface areas and also the edge areas of the encapsulation material.

Other solutions, for example the adhesion of a glass frame or a glass dome, which are transparent, UV-resistant, and temperature-resistant, require a very complicated installation of the frame and a compactness of the frame that is hard to produce. Such a solution is also associated with a greater weight than a "dam and fill" solution. For rigid glass materials, a usually required adaptation of the thermal expansion coefficients of the composite materials also represents another hurdle, especially when the subsequent products are exposed to thermal cycles.

For a combination solution made of a glass frame and an encapsulation with a suitable non-epoxy resin-based material, such as a temperature-resistant and UV-resistant silicone, very small gaps between the frame and substrate can have the effect that the silicone, which has strong creeping properties, can run out during the casting. Space for the frame also must be provided on the substrate. This adversely affects the best possible utilization of the substrate surface and/or a desired stackability.

For the use of chip-on-board technology for the production of high-power UV LED modules that emit over a planar area or of photodiode arrays, a flat encapsulation that avoids the mentioned disadvantages is advantageous. For reasons of optical efficiency and best possible stackability of modules, the encapsulation should have transparent faces and also edge areas. High temperature resistance and UV resistance are likewise relevant both for the production of corresponding optoelectronic components and also for long-term, stable functioning.

BRIEF SUMMARY OF THE INVENTION

Starting from this prior art and these requirements, the present invention is based on the object of providing a method for coating an optoelectronic chip-on-board module and a corresponding, coated optoelectronic chip-on-board module, in which a UV-resistant and temperature-resistant coating is realized and the most efficient utilization possible of the surface area available on the chip-on-board module is achieved.

This object is achieved according to the invention by a method for coating an optoelectronic chip-on-board module, which comprises a flat substrate populated with one or more optoelectronic components, with a transparent, UV-resistant, and temperature-resistant coating made of one or more silicones, which is characterized by the following process steps:

a) preheating the substrate to be coated to a first temperature;

b) applying on the preheated substrate a dam that encloses a surface or partial area of the substrate to be coated, the dam being made of a first, heat-curable, highly reactive silicone that cures at the first temperature;

c) filling the surface or partial area of the substrate enclosed by the dam with a liquid second silicone; and d) curing the second silicone.

The method according to the invention involves the basic idea that silicones are used as the dam material in a modified "dam and fill" method. This was previously not possible, because silicones cannot become thixotropic without losing their transparency. Instead of making the silicones thixotropic, according to the invention highly reactive silicones are used, which are applied onto the preheated substrate. Since the substrate is preheated to a temperature at which the highly reactive silicone cures and also the volume and mass of the highly reactive silicone used as the dam material are very low, the applied dam material cures very quickly, before it can flow. In this manner, raised geometries can be implemented.

A highly reactive silicone is understood to be a silicone that cross-links or cures quickly at the first temperature and forms a transparent dam without starting to flow, when it meets the substrate in the method according to the invention. The curing time preferably lies in the range of up to 10 seconds, preferably less than 5 seconds. Such silicones are known. Accelerating the curing can also be achieved, if the first silicone contains radiation-sensitive initiators and it is irradiated with radiation after the application, in particular with visible or ultraviolet light, so that a pre-cross-linking is initiated, while the main cross-linking takes place thermally.

Since a dam made of silicone is applied in this manner in the form of a pan or frame on the substrate, the pan defined by the dam can then be filled with liquid silicone in a "dam and fill" process, and this silicone is thereafter cured, usually with heat. Curing by radiation can also be used as an alternative or in addition thereto. The application of the dam takes place in a relative movement of the dispensing device or nozzle and module, wherein the dispensing device can be stationary and the module is moved, or vice versa.

According to the invention, the silicone dam is just as transparent as the silicone filling, so that there is absolutely no adverse optical effect due to the silicone dam. The flat encapsulation is thus completely functional. In this manner, the efficiency of the coating is substantially increased and it is possible to make more use of the area available on the substrate than was previously the case, since conventional dams were not transparent and the area covered by the dams was not available for optoelectronic components.

In the method according to the invention, the first temperature in the processing step a) is a temperature of typically between 100° C. and 150° C. or above, which is adjusted to allow quick curing of the highly reactive silicone for the dam, without damaging the optoelectronic components on the substrate.

To ensure a uniform and uninterrupted filling of the surface area or partial area of the substrate enclosed by the dam, it is provided in one advantageous embodiment that after the step b) and before the step c), the substrate is cooled and/or allowed to cool to a second temperature that is below the first temperature, in particular also below a curing temperature of the second silicone. This is then especially advantageous if the second silicone also cures at the first temperature. With the substrate cooled to the second temperature, the second silicone can spread uniformly without curing and is cured in the next step after the uniform and uninterrupted spreading. This can take place, in turn, by increasing the temperature and/or by radiation curing.

Additionally or alternatively, it is preferably provided that the second silicone is equally reactive or less reactive than the first silicone used for generating a dam, or the same silicone is used as the first silicone and as the second silicone. If the second silicone is less reactive, an uninterrupted and uniform filling of the surface enclosed by the dam can also be performed when the temperature of the substrate is not lowered or only slightly lowered.

One advantageous, especially efficient use of the area available on the substrate is possible, if the dam is applied at least in some areas at the edge of the substrate. In this manner, it is possible to increase the design freedom and, in particular, to apply a transparent and UV-resistant and temperature-resistant coating on the entire surface of the substrate.

It is further preferred when the dam is applied over optoelectronic components, bonding wires, or other components, so that the area use of the coating is not limited by having to consider the arrangement of optical chips, bonding wires, or other components. Instead, the dam can be arranged on the substrate in any desired way.

The method is advantageously improved if the dam is applied with a cross-sectional profile that causes an optical focusing or scattering of light. In this manner, the light output in the edge area can be modeled as desired. This also improves the stackability of adjacent modules, because shadows are avoided in the edge area. The shape of the dam is made possible by the spontaneous curing of the silicone material for the dam and the influence of its curing properties by the adjustment of the processing parameters. The corresponding processing parameters are, in particular, the reactivity of the silicone material being used, the temperature of the substrate, and the deposition rate of the dam, as well as the shape of the nozzle being used and a distance between the nozzle being used and the substrate.

Preferably, optically functional materials, in particular, phosphorescing and/or light-scattering materials or particles, are or will be mixed into the first silicone and/or the second silicone. Phosphorescing materials provide a wavelength shift, so that a desired setting of the emitted wavelength is possible, among other things, for LED modules. Light-scattering particles and materials ensure that a uniform illumination or light emission is generated, especially for lamp modules. Other materials that can be mixed in are, for example, color-absorbing or color-activating materials.

The method according to the invention is similarly advantageously improved, if drops of the first silicone are deposited as quickly curing lenses on individual optoelectronic components of the substrate. In this case, these drops form islands within the region enclosed by the dam and define the optical properties of the coating above the optoelectronic components on the substrate. Around these drop-shaped lenses, the surface enclosed by the dam is then filled with the second silicone. Here, the lenses preferably project out from the second silicone.

Particularly defect-free coatings are produced, if the first and/or the second silicone is pretreated under a vacuum, in particular at approximately 10 mbar. In this manner, gas enclosed in the liquid silicone is extracted from the silicone. The application and/or the curing of the first and/or the second silicone can be realized advantageously at a pressure higher than atmospheric pressure, in particular from 4 to 10 bar, in particular at approximately 5 to 7 bar. In this manner, gas bubbles that are generated during the casting and enclosed in the silicone are reduced in size to such an extent that they disappear and the gas contained in these bubbles diffuses into and through the silicone without forming defects.

The object forming the basis of the invention is also achieved by an optoelectronic chip-on-board module, comprising a flat substrate populated with one or more optoelectronic components, having a transparent, UV-resistant, and temperature-resistant coating made of one or more silicones. This module is wherein the coating comprises a dam that encloses a surface area or a partial area of the substrate and is made of a cured first silicone and a second silicone that is filled and cured in the surface area or partial area. Such an optoelectronic chip-on-board module according to the invention is provided in any desired way, especially over its entire surface, with a transparent, UV-resistant, and temperature-resistant coating, so that optionally the entire surface of a substrate is available for optical components. The arrangement of the optoelectronic components on the substrate is thus not limited by specifications and constraints of the coating.

With suitable silicones a UV-resistant protection is provided up to intensities of a few 10 W/cm$^2$ and up to a temperature of typically approximately 200° C. This protection comprises both the surface region and also the edge region of the substrate or the chip-on-board module underneath the coating and also mechanically protects the module and the connection components.

Advantageously, the optoelectronic chip-on-board module according to the invention is produced or can be produced by the method according to the invention described above. Thus, it also already has the properties and advantages described in connection with the method according to the invention.

Preferably, the dam runs at least in some sections to an edge of the substrate. Thus, it is possible to utilize the surface present on the substrate optimally for optoelectronic components as desired. An edge left free due to reasons related to producing a coating is superfluous.

Preferably, the first silicone and the second silicone are made of the same material or have, in the cured state, the same optical properties, in particular with reference to transparency, color, and/or refractive index. Thus, the coating of the chip-on-board module preferably has overall the same or similar optical properties at each point. In addition, the dam can advantageously be shaped in cross section, such that it has beam-focusing or beam-scattering properties.

Preferably, the substrate is populated with optoelectronic components up to an edge or up to shortly before an edge, so that the surface available on the substrate is optimally utilized and the optoelectronic components are protected.

The object forming the basis of the invention is also achieved by a system having two or more optoelectronic chip-on-board modules described above according to the invention, wherein the substrates of the optoelectronic chip-on-board modules are arranged flush next to one another, wherein especially due to the substrates being populated with optoelectronic components up to their edges, a regular arrangement and spacing of optoelectronic components is produced even across the boundaries between adjacent substrates. Thus, a uniform and edge-less utilization of the available surface with optical components, for example LEDs or photodiodes, is possible also for the joining of several chip-on-board modules.

The subjects of the invention, that is, the method according to the invention, the optoelectronic chip-on-board module according to the invention, and the system according to the invention, have in common that the hardness of the silicone can be selected, typically between a gel and a Shore hardness close to 100, so that thermally induced tensions, which occur due to different coefficients of expansion between the substrate, chip-on-board components, and connection materials, can be damped.

The other features, properties, and advantages mentioned above with respect to the individual subjects of the invention also apply without restriction to other subjects of the invention.

BRIEF DESCRIPTION OF THE SEVERAL VIEWS OF THE DRAWINGS

The invention is described below based on embodiments with reference to the drawings without limiting the general concept of the invention, wherein reference is made explicitly to the drawings with regard to all of the details according to the invention not explained in more detail in the text. Shown are.

In the figures the same or similar elements or corresponding parts are provided respectively with the same reference numerals, so that a corresponding repeated description is dispensed with.

DETAILED DESCRIPTION OF THE INVENTION

The invention will be explained with reference to chip-on-board LED modules, that is, with reference to illuminating bodies, as an example of an optoelectronic chip-on-board module. In the scope of the invention, instead of LED modules as the optoelectronic components, also photodiodes in solar cells or other components can be used.

Figure 1:
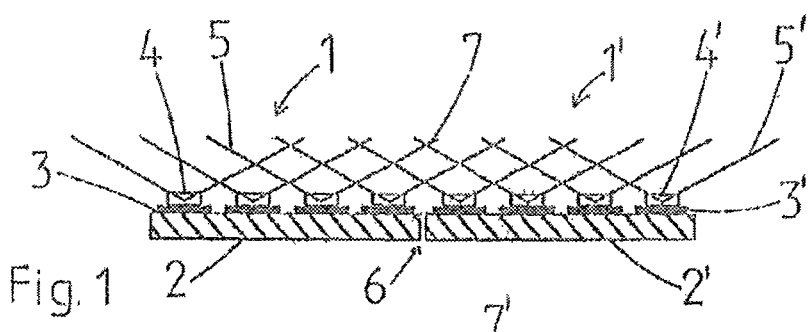
FIG. 1 is a schematic representation of a conventional chip-on-board LED module.

In FIG. 1 a chip-on-board LED module 1 without a coating is shown schematically in cross section, in which strip conductors 3, 3' and LEDs 4, 4' formed as unhoused LED chips are arranged in a regular spacing on two parallel substrates 2, 2' or carriers. For reasons of clarity, not all of the recurring elements of FIG. 1 and the following figures are provided with reference numerals, but these refer to all identical elements. Thus, in FIG. 1 only one LED 4, 4' is provided with a reference numeral for each of the two chip-on-board LED modules 1, 1'. The other components are of the same type.

A substrate 2, 2' can be, for example, a metal, ceramic, or silicon substrate built using rigid, semi-flexible, or flexible substrate technology, a metal core or FR4 circuit board, a glass substrate, or a plastic substrate metal core circuit board.

Light cones 5, 5' of the LEDs 4, 4' are shown with lines. The LEDs are approximately Lambert radiators, which emit approximately 75% of the entire emitted light output within an opening angle of 120°. If the surface populated with LEDs 4, 4' expands relative to the measured spacing and the spacing is sufficiently greater than the spacing of the LED chips, also called "pitch," then a homogeneous intensity distribution having properties similar to that of a homogeneous, diffusely illuminating surface is measured.

In the case shown in FIG. 1, the homogeneous intensity distribution also continues across the joint 6 between adjacent modules 1, 1', because the overlapping area 7 of the light cones 5, 5' is well formed at this position, due to the regular and up to the edge population of the substrates 2, 2' with LEDs 4, 4' and due to the lack of optical obstructions.

Figure 2:
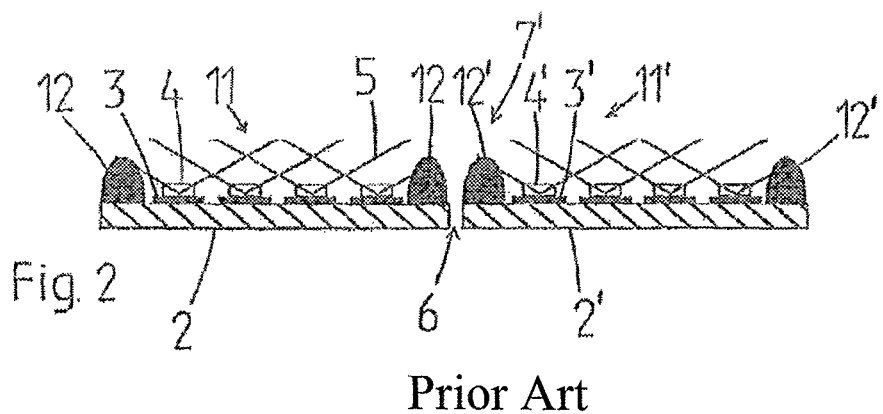
FIG. 2 is a schematic representation of a system having two chip-on-board LED modules with conventional dams.

FIG. 2 shows schematically the emission of a system made of several chip-on-board modules 2, 2' placed next to one another, when these modules are coated with a conventional "dam and fill" method. For reasons of clarity of the coating only the dams 12, 12' made of a non-transparent material are shown. Due to the non-transparency of the dams 12, 12', the emission cones 5, 5' of the LEDs 4, 4' are cut off at these dams 12, 12'. Accordingly, at the joint 6 a limited overlapping area 7' is produced, at which the luminous density is significantly reduced relative to the example shown in FIG. 1.

In addition, the conventional dams 12, 12' cannot be placed on the LEDs 4, 4', but instead require their own space. The edge area of the substrates 2, 2' must be left free of LEDs 4, 4' on the chip-on-board LED modules 11, 11' in FIG. 2. This increased spacing at the edges of the substrates 2, 2' leads to further worsening of the homogeneity of the light emissions at the joint 6.

Figure 3:
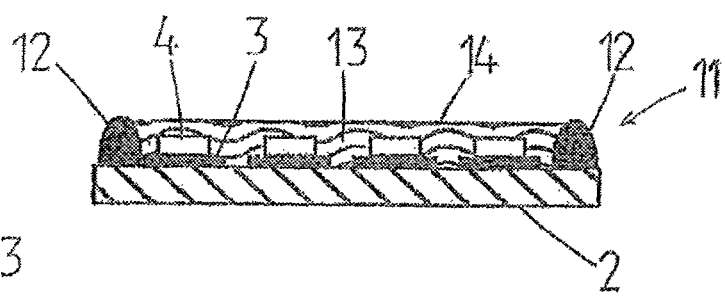
FIG. 3 is a schematic representation of a chip-on-board LED module coated in a conventional way.

FIG. 3 shows schematically a chip-on-board LED module 11, as also shown in FIG. 2, however in this case without the light cones 5, 5', but instead with the representation of the filling compound 13 made of epoxy resin. The coating made of the dams 12 and the epoxy resin 13 mechanically protects the optoelectronic components, i.e., the LEDs 4 and the strip conductors as well as the substrate 2 of the chip-on-board LED module 11, but they are not UV-resistant. In addition, the dam 12 is not transparent.

Figure 4:
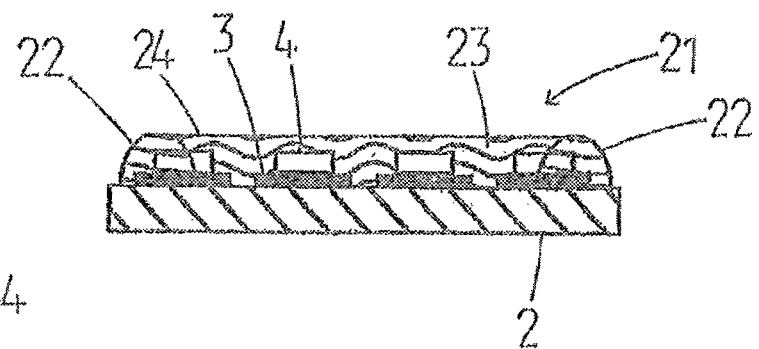
FIG. 4 is a schematic representation of a chip-on-board LED module coated according to an embodiment of the invention.

FIG. 4 shows schematically a chip-on-board LED module 21 according to the invention, which has, in addition to the usual components of substrate 2, strip conductors 3, and LEDs 4, a coating 24 comprising a dam 22 made of a highly reactive silicone and a filling compound 23 made of a silicone. This coating 24 is transparent both in the filling compound 23 and also in the dam 22, so that the LEDs 4 can be arranged in a regular distribution up to the edge of the substrate 2. The dam 22 is applied partially over the LEDs 4 on the substrate 2, but does not block their light emissions due to its transparency.

The production is performed in that initially the substrate 2 is heated with the components, i.e., the strip conductors 3 and the LED chips 4, arranged thereon, and then the dam 22 made of a highly reactive silicone is deposited in a desired way on the substrate 2. Since it is a very small amount and the temperature of the substrate 2 is at or above the curing temperature of the silicone, the silicone of the dam 22 cures before it can creep or flow. A radiation-induced pre-curing can also be performed, if the silicone contains corresponding initiators. Thereafter the dam, which projects above the height of the LEDs 4 over the substrate 2, is filled with liquid silicone 23, and the silicone is then cured.

This modified "dam and fill" method allows, for the first time, a transparent, UV-resistant, and temperature-resistant coating of optoelectronic chip-on-board modules.

All of the mentioned features, even those that can be gathered just from the drawings, and also individual features, which are disclosed in combination with other features, are considered essential to the invention alone and in combination. Embodiments according to the invention can be realized by individual features or a combination of several features.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. An optoelectronic chip-on-board module comprising:
   a flat substrate populated with at least one optoelectronic component; and
   a transparent, UV-resistant, and temperature-resistant coating comprising:
      a dam enclosing at least a partial surface of the flat substrate, the dam comprising a cured, highly reactive first silicone which partially covers a plurality of lateral surfaces and a portion of a top surface of the at least one optoelectronic component, and
      a liquid second silicone filled in and cured in the at least partial surface area enclosed by the dam on the flat substrate, the second silicone covering portions of the plurality of lateral surfaces and a remaining portion of the top surface of the at least one optoelectronic component,
         wherein the first silicone and the second silicone are transparent to light that emits from the at least one optoelectronic component.

2. The optoelectronic chip-on-board module according to claim 1, wherein the dam runs at least in some sections to an edge of the flat substrate.

3. The optoelectronic chip-on-board module according to claim 1, wherein the cured first silicone and the second silicone comprise the same silicone.

4. The optoelectronic chip-on-board module according to claim 3, wherein the cured first silicone and the second silicone have, in a cured state, the same optical properties with regard to at least one of transparency, color, and refractive index.

5. The optoelectronic chip-on-board module according to claim 1, wherein the flat substrate is populated with optoelectronic components up to an edge or up to shortly before an edge of the flat substrate.

6. A system comprising at least two optoelectronic chip-on-board modules according to claim 1, wherein adjacent flat substrates of the optoelectronic chip-on-board modules have edges arranged flush with each other, and wherein the adjacent flat substrates are populated with optoelectronic components up to the flush edges, such that a regular arrangement and spacing of optoelectronic components results, even across boundaries between the adjacent flat substrates.

* * * * *